(12) United States Patent
Oyama

(10) Patent No.: US 12,712,129 B2
(45) Date of Patent: Aug. 18, 2026

(54) MULTILAYER CERAMIC CAPACITOR AND MOUNTING STRUCTURE FOR MULTILAYER CERAMIC CAPACITOR

(71) Applicant: Murata Manufacturing Co., Ltd., Nagaokakyo (JP)

(72) Inventor: Daisuke Oyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 128 days.

(21) Appl. No.: 18/822,784

(22) Filed: Sep. 3, 2024

(65) Prior Publication Data

US 2024/0428994 A1 Dec. 26, 2024

Related U.S. Application Data

(63) Continuation of application No. PCT/JP2023/015062, filed on Apr. 13, 2023.

(30) Foreign Application Priority Data

Jun. 21, 2022 (JP) ................................ 2022-099622

(51) Int. Cl.
*H01G 4/232* (2006.01)
*H01G 4/30* (2006.01)
*H05K 1/181* (2026.01)

(52) U.S. Cl.
CPC ............... *H01G 4/232* (2013.01); *H01G 4/30* (2013.01); *H05K 1/181* (2013.01); *H05K 2201/10015* (2013.01)

(58) Field of Classification Search
CPC ........ H01G 4/012; H01G 4/232; H01G 4/252; H01G 4/30
See application file for complete search history.

(56) References Cited

U.S. PATENT DOCUMENTS

2017/0098506 A1* 4/2017 Ando .................... H01G 4/228
2019/0066925 A1 2/2019 Satoh et al.
(Continued)

FOREIGN PATENT DOCUMENTS

JP H1022164 A 1/1998
JP 2017073434 A 4/2017
(Continued)

OTHER PUBLICATIONS

International Search Report in PCT/JP2023/015062, mailed Jun. 27, 2023, 2 pages.

*Primary Examiner* — Nathan Milakovich
(74) *Attorney, Agent, or Firm* — Keating & Bennett, LLP

(57) ABSTRACT

A multilayer ceramic capacitor includes a multilayer body including internal electrode layers and dielectric layers that are alternately laminated, main surfaces opposite to each other in a lamination direction, end surfaces opposite to each other in a length direction that intersects with the lamination direction, and side surfaces opposite to each other in a width direction that intersects with the lamination direction and the length direction, and external electrodes on the end surfaces. Each of the external electrodes includes a thickest portion at a position off-center in the width direction toward either one of the side surfaces, and the thickest portion is thicker in the length direction than a remainder of the external electrode.

20 Claims, 12 Drawing Sheets

(56) References Cited

U.S. PATENT DOCUMENTS

| | | | | |
|---|---|---|---|---|
| 2019/0096576 | A1* | 3/2019 | Onodera | H01G 4/232 |
| 2020/0312551 | A1 | 10/2020 | Nagai et al. | |
| 2021/0280374 | A1 | 9/2021 | Nishikawa | |
| 2021/0335542 | A1* | 10/2021 | Matsushita | H01G 2/065 |
| 2024/0266111 | A1* | 8/2024 | Shimada | H01G 4/232 |

FOREIGN PATENT DOCUMENTS

| | | | |
|---|---|---|---|
| JP | 2019046914 | A | 3/2019 |
| JP | 2019067787 | A | 4/2019 |
| JP | 2020161517 | A | 10/2020 |
| JP | 2021141191 | A | 9/2021 |
| KR | 20200115204 | A | 10/2020 |

* cited by examiner

T
L
1
2
30B,30
C2,C
5B, 5
3B, 3
5Bb
5Ba
A1,A
A2,A
5Aa
5Ab
3A, 3
7
5A,5
4
30A,30
C1,C
7
6

Comparative Example

MULTILAYER CERAMIC CAPACITOR AND MOUNTING STRUCTURE FOR MULTILAYER CERAMIC CAPACITOR

CROSS REFERENCE TO RELATED APPLICATIONS

This application claims the benefit of priority to Japanese Patent Application No. 2022-099622 filed on Jun. 21, 2022 and is a Continuation Application of PCT Application No. PCT/JP2023/015062 filed on Apr. 13, 2023. The entire contents of each application are hereby incorporated herein by reference.

BACKGROUND OF THE INVENTION

1. Field of the Invention

The present invention relates to multilayer ceramic capacitors and mounting structures for such multilayer ceramic capacitors.

2. Description of the Related Art

A multilayer ceramic capacitor includes a multilayer body in which a plurality of internal electrode layers and a plurality of dielectric layers are alternately laminated, and external electrodes respectively disposed on end surfaces of the multilayer body. In general, the external electrodes of the multilayer ceramic capacitor are connected to mounting lands on a circuit board with solder (see Japanese Unexamined Patent Application, Publication No. 2021-141191).

SUMMARY OF THE INVENTION

The multilayer ceramic capacitor is connected to the circuit board by way of reflow soldering. At the time of reflow soldering, there may be variations such as a difference in time for solder wetting, a difference in area between the left and right mounting lands, difference in amount of solder, a difference in temperature, a difference in mounting position, etc. The variations may cause a so-called tombstone phenomenon in which one of the pair of external electrodes rises due to an imbalance between tensile forces applied to the pair of external electrodes by the solder.

Example embodiments of the present invention provide multilayer ceramic capacitors and mounting structures for the multilayer ceramic capacitors that reduce the occurrence of the tombstone phenomenon.

An example embodiment of the present invention provides a multilayer ceramic capacitor including a multilayer body including a plurality of internal electrode layers and a plurality of dielectric layers that are alternately laminated, the multilayer body including surfaces opposite to each other in a lamination direction defining main surfaces, surfaces opposite to each other in a length direction that intersects with the lamination direction defining end surfaces, and surfaces opposite to each other in a width direction that intersects with the lamination direction and the length direction defining side surfaces, and external electrodes on the end surfaces of the multilayer body, respectively, each of the external electrodes including a thickest portion at a position off-center in the width direction toward either one of the side surfaces, the thickest portion being thicker in the length direction than a remainder of the external electrode.

An example embodiment of the present invention provides a mounting structure to mount the multilayer ceramic capacitor according to an example embodiment described above on a circuit board, wherein one of the main surfaces that is closer to the thickest portion of the multilayer ceramic capacitor faces the circuit board.

Multilayer ceramic capacitors and mounting structures for the multilayer ceramic capacitors according to example embodiments of the present invention are capable of reducing or preventing the occurrence of the tombstone phenomenon.

The above and other elements, features, steps, characteristics and advantages of the present invention will become more apparent from the following detailed description of the example embodiments with reference to the attached drawings.

BRIEF DESCRIPTION OF THE DRAWINGS

FIG. 4A illustrates an example embodiment of the present invention, and FIGS. 4B to 4D illustrate modifications of example embodiments of the present invention.

DETAILED DESCRIPTION OF THE EXAMPLE EMBODIMENTS

Figure 1:
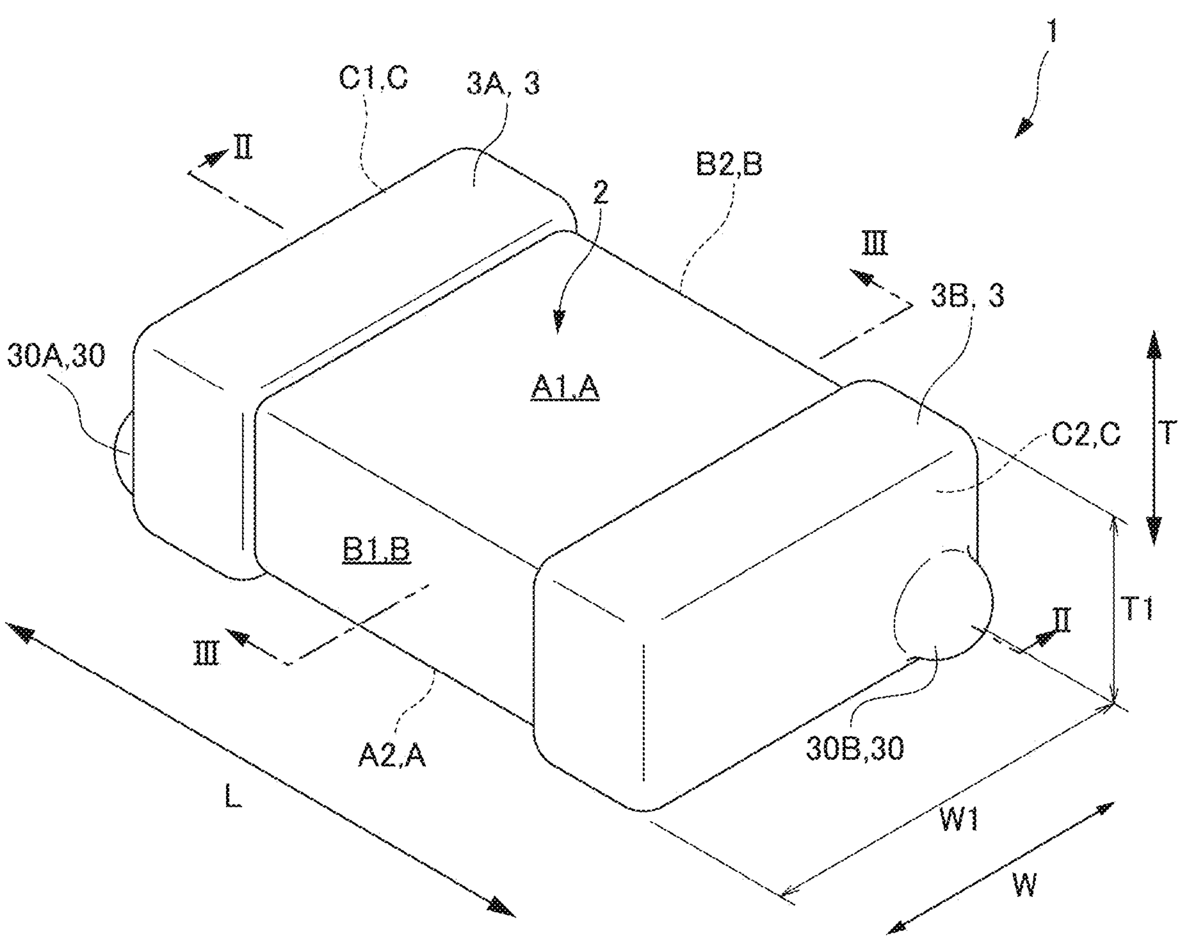
FIG. 1 is a schematic perspective view of a multilayer ceramic capacitor 1 according to an example embodiment of the present invention.
Figure 2:
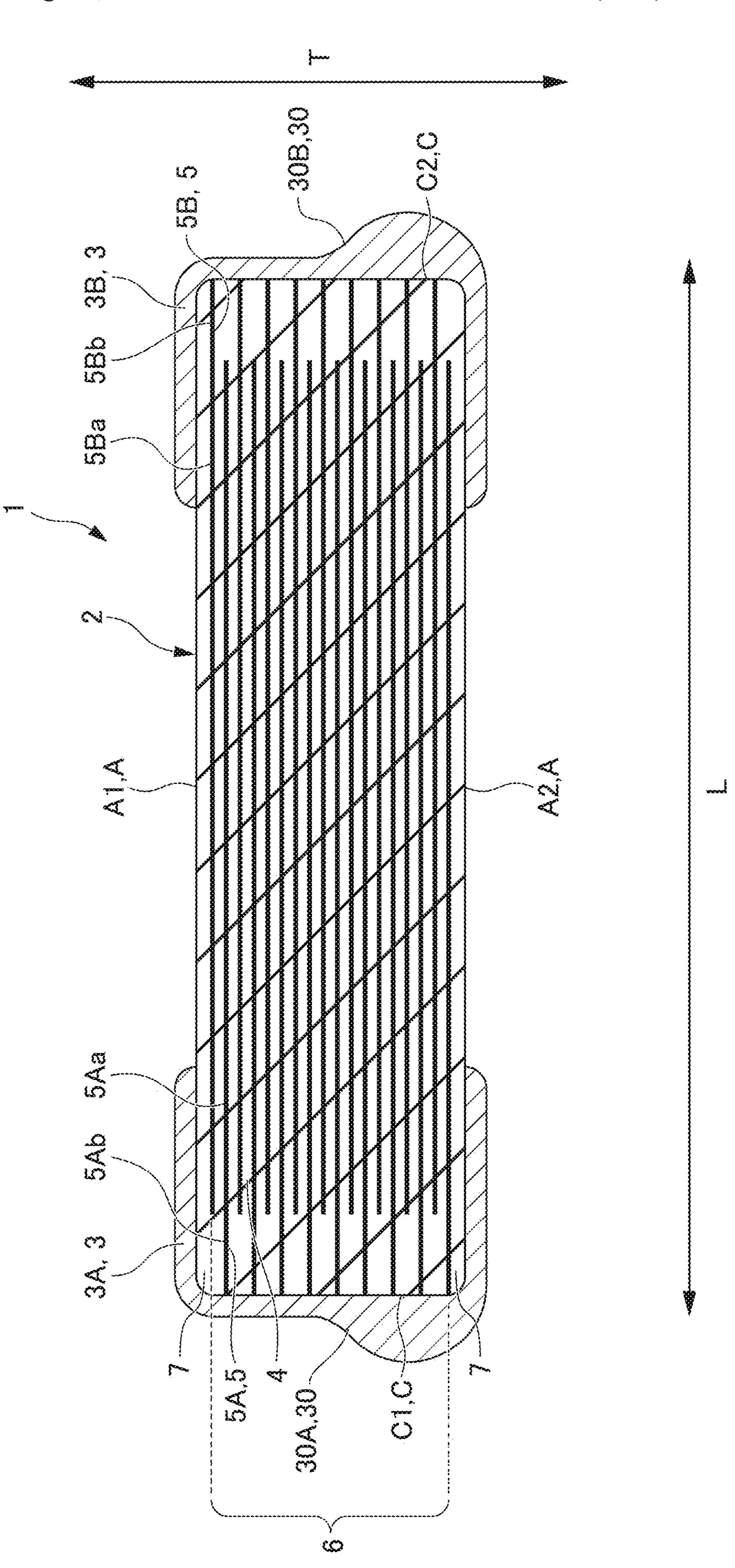
FIG. 2 is a cross-sectional view of the multilayer ceramic capacitor 1 of FIG. 1, taken along line II-II passing through thickest portions 30 to be described later.
Figure 3:
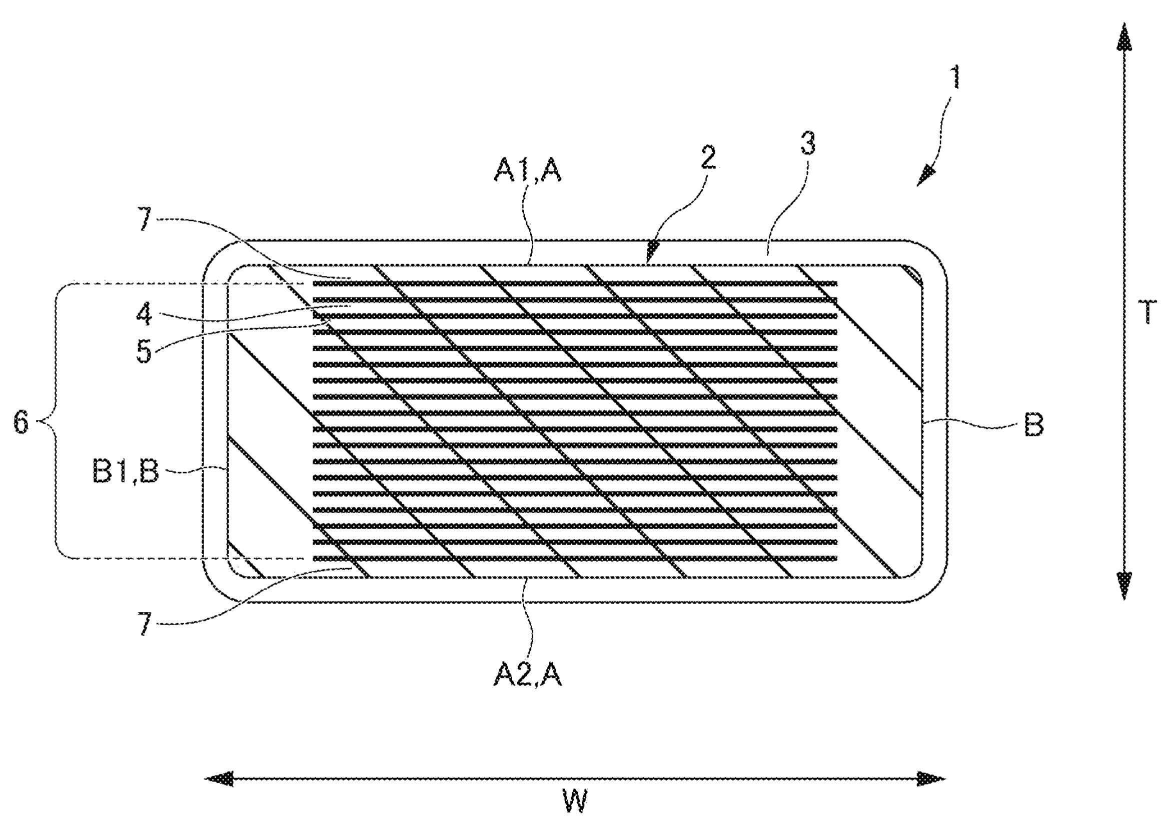
FIG. 3 is a cross-sectional view of the multilayer ceramic capacitor 1 of FIG. 1, taken along line III-III.

Multilayer ceramic capacitors according to example embodiments of the present invention will be described below. FIG. 1 is a schematic perspective view of a multilayer ceramic capacitor 1 according to an example embodiment. FIG. 2 is a cross-sectional view of the multilayer ceramic capacitor 1 of FIG. 1, taken along the line II-II passing through thickest portions 30, which will be described later. FIG. 3 is a cross-sectional view of the multilayer ceramic capacitor 1 of FIG. 1, taken along the line III-III.

Multilayer Ceramic Capacitor 1

The multilayer ceramic capacitor 1 has a substantially rectangular parallelepiped shape and includes a multilayer body 2 and a pair of external electrodes 3 provided at both ends of the multilayer body 2. The multilayer body 2 includes an inner layer portion 6 in which a plurality of dielectric layers 4 and a plurality of internal electrode layers 5 are laminated.

In the following description, the orientation of the multilayer ceramic capacitor 1 is described using the following terms. A direction in which the pair of external electrodes 3 on the multilayer ceramic capacitor 1 are arranged is referred to as a length direction L. A direction in which the dielectric layers 4 and the internal electrode layers 5 are laminated is referred to as a lamination direction T. A direction intersecting with both the length direction L and the lamination direction T is referred to as a width direction W. In the present example embodiment, the width direction W is orthogonal to both the length direction L and the lamination direction T. As illustrated in FIG. 1, the multilayer ceramic capacitor 1 of the present example embodiment has a width W1 and a thickness T1 in the lamination direction T, and W1/2≥T1 is satisfied. However, the present invention is not limited to this configuration.

In the following description, among the six outer surfaces of the multilayer body 2, a pair of outer surfaces opposite to each other in the lamination direction T are referred to as a first main surface A1 and a second main surface A2, a pair of outer surfaces opposite to each other in the width direction w are referred to as a first side surface B1 and a second side surface B2, and a pair of outer surfaces opposite to each other in the length direction L are referred to as a first end surface C1 and a second end surface C2. The first main surface A1 and the second main surface A2 are collectively referred to as a main surface(s) A when it is unnecessary to particularly distinguish from each other. The first side surface B1 and the second side surface B2 are collectively referred to as a side surface(s) B when it is unnecessary to particularly distinguish from each other. The first end surface C1 and the second end surface C2 are collectively referred to as an end surface(s) C when it is unnecessary to particularly distinguish from each other.

Multilayer Body 2

The multilayer body 2 includes the inner layer portion 6 and outer layer portions 7 disposed on sides of the inner layer portion 6 that are adjacent to the main surfaces A.

Inner Layer Portion 6

In the inner layer portion 6, the plurality of dielectric layers 4 and the plurality of internal electrode layers 5 are laminated.

Dielectric Layer 4

The dielectric layers 4 are made of a ceramic material.

Internal Electrode Layer 5

The internal electrode layers 5 include a plurality of first internal electrode layers 5A and a plurality of second internal electrode layers 5B. The first internal electrode layers 5A and the second internal electrode layers 5B are alternately arranged. The first internal electrode layer 5A and the second internal electrode layer 5B are collectively referred to as the internal electrode layer(s) 5 when it is unnecessary to particularly distinguish from each other.

Each first internal electrode layer 5A includes a first counter portion 5Aa opposed to the second internal electrode layers 5B, and a first lead-out portion 5Ab extending from the first counter portion 5Aa to be led out to the first end surface C1. An end of each first lead-out portion 5Ab is exposed at the first end surface C1 and is electrically connected to a first external electrode 3A, which will be described later. Each second internal electrode layer 5B includes a second counter portion 5Ba opposed to the first internal electrode layers 5A, and a second lead-out portion 5Bb extending from the second counter portion 5Ba to be led out to the second end surface C2. An end of each second lead-out portion 5Bb is exposed at the second end surface C2 and is electrically connected to the second external electrode 3B, which will be described later.

Electric charge is accumulated in the first counter portions 5Aa of the first internal electrode layers 5A and the second counter portions 5Ba of the second internal electrode layers 5B, thereby fulfilling the function of a capacitor. The first counter portion 5Aa and the second counter portion 5Ba are collectively referred to as a counter portion(s) *5a* when it is unnecessary to particularly distinguish from each other. The first lead-out portion 5Ab and the second lead-out portion 5Bb are collectively referred to as a lead-out portion(s) *5b* when it is unnecessary to particularly distinguish from each other.

Outer Layer Portion 7

The outer layer portions 7 are made of the same dielectric ceramic material as that of the dielectric layers 4 of the inner layer portion 6.

External Electrode 3

The external electrodes 3 include the first external electrode 3A provided on the first end surface C1 of the multilayer body 2 and the second external electrode 3B provided on the second end surface C2 of the multilayer body 2. The first external electrode 3A and the second external electrode 3B are collectively referred to as the external electrode(s) 3 when it is unnecessary to particularly distinguish from each other. Each external electrode 3 covers not only the end surface C but also a portion of the main surfaces A and a portion of the side surfaces B that are adjacent to the end surface C.

Thickest Portion 30

Thickest portions 30 are provided on the first external electrode 3A and the second external electrode 3B, respectively. In the present example embodiment, the thickest portions 30 are formed on the first and second external electrodes 3A and 3B on a one-to-one basis. Each thickest portion 30 defines a portion of the external electrode 3, is thicker in the length direction L than the remainder of the external electrode 3, and defines a convexity protruding from the remainder of the external electrode 3. Each thickest portion 30 preferably protrudes by about 10 μm or more in the length direction L, for example.

The thickest portion 30 on the first external electrode 3A is referred to as a first thickest portion 30A, and the thickest portion 30 on the second external electrode 3B is referred to as a second thickest portion 30B. The first thickest portion 30A and the second thickest portion 30B are collectively referred to as the thickest portion(s) 30 when it is unnecessary to particularly distinguish from each other.

Each thickest portion 30 is provided on the external electrode 3 at a position off-center in the width direction W toward either one of the first side surface B1 and the second side surface B2. It is preferable that the first thickest portion 30A is provided at an off-center position toward one of the first side surface B1 and the second side surface B2, and the second thickest portion 30B is provided at an off-center position toward the other of the first side surface B1 and the second side surface B2. In the present example embodiment, the first thickest portion 30A is provided at an off-center position toward the first side surface B1, and the second thickest portion 30B is provided at an off-center position toward the second side surface B2. However, the present invention is not limited to this configuration, and both the first thickest portion 30A and the second thickest portion 30B may be off-center toward the same one of the first side surface B1 and the second side surface B2.

Furthermore, the position on the external electrode 3 at which each thickest portion 30 is located is off-center in the lamination direction T toward either one of the first main surface A1 and the second main surface A2. It is preferable that both the first thickest portion 30A and the second thickest portion 30B are off-center toward the same one of the first main surface A1 and the second main surface A2. It is more preferable that both the first thickest portion 30A and the second thickest portion 30B are off-center toward the second main surface A2, which serves as a mounting surface to be mounted on the circuit board 60 (to be described later), of the first main surface A1 and the second main surface A2.

Figure 4A:
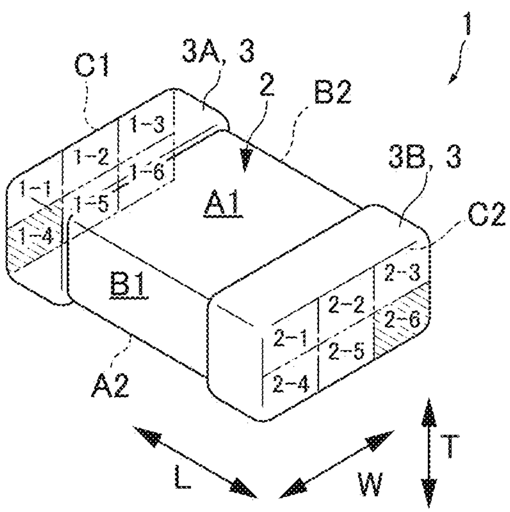
FIGS. 4A to 4D are diagrams illustrating examples of positions of a first thickest portion 30A and a second thickest portion 30B, where
Figure 4B:
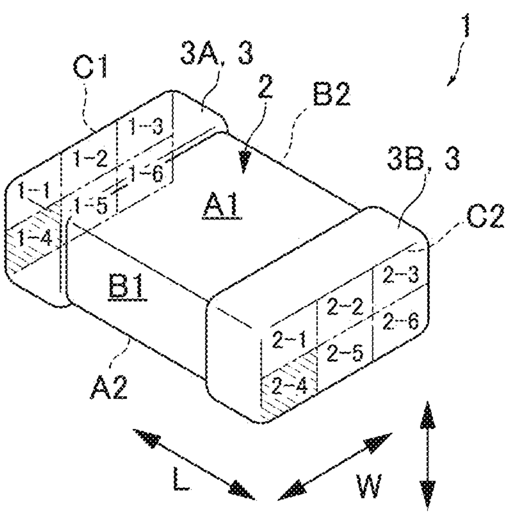
Figure 4C:
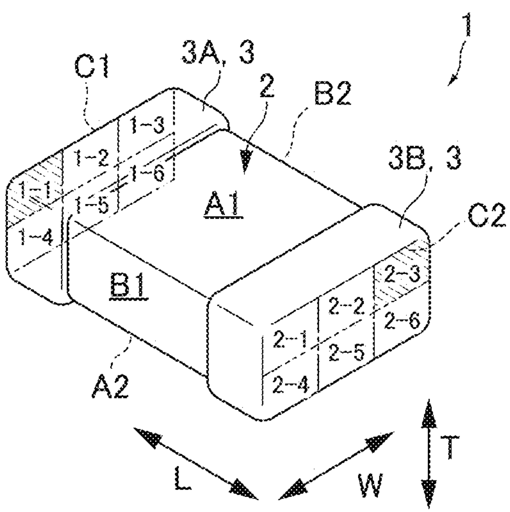
Figure 4D:
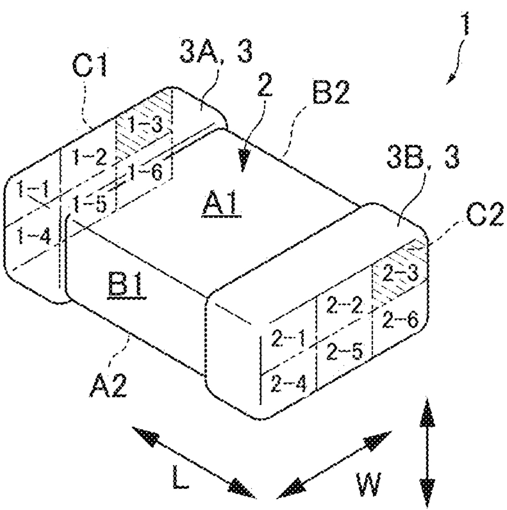

Next, the positions of the first thickest portion 30A and the second thickest portion 30B of the multilayer ceramic capacitor 1 will be specifically described. FIGS. 4A to 4D are diagrams illustrating examples of the positions of the first thickest portion 30A and the second thickest portion 30B. FIG. 4A is a diagram illustrating the positions of the first thickest portion 30A and the second thickest portion 30B of the multilayer ceramic capacitor 1 of the example embodiment illustrated in FIG. 1. FIGS. 4B, 4C, and 4D are diagrams illustrating the positions of the first thickest portion 30A and the second thickest portion 30B of multilayer ceramic capacitors 1 according to modifications. In FIGS. 4A to 4D, portions where the thickest portions 30 are provided are marked with diagonal lines. The second main surface A2 serves as the mounting surface to be mounted on the circuit board 60.

As illustrated, the first external electrode 3A is divided into two equal or substantially equal portions in the lamination direction T and into three equal portions in the width direction W. The portion adjacent to the first main surface A1 and the first side surface B1 is referred to as a region 1-1, the portion adjacent to the first main surface A1 and centered in the width direction W is referred to as a region 1-2, the portion adjacent to the first main surface A1 and the second side surface B2 is referred to as a region 1-3, the portion adjacent to the second main surface A2 and the first side surface B1 is referred to as a region 1-4, the portion adjacent to the second main surface A2 and centered in the width direction W is referred to as a region 1-5, and the portion adjacent to the second main surface A2 and the second side surface B2 is referred to as a region 1-6.

The second external electrode 3B is divided into two equal or substantially equal portions in the lamination direction T and into three equal or substantially equal portions in the width direction W. The portion adjacent to the first main surface A1 and the first side surface B1 is referred to as a region 2-1, the portion adjacent to the first main surface A1 and centered in the width direction W is referred to as a region 2-2, the portion adjacent to the first main surface A1 and the second side surface B2 is referred to as a region 2-3, the portion adjacent to the second main surface A2 and the first side surface B1 is referred to as a region 2-4, the portion adjacent to the second main surface A2 and centered in the width direction W is referred to as a region 2-5, and the portion adjacent to the second main surface A2 and the second side surface B2 is referred to as a region 2-6.

In FIG. 4A, the first thickest portion 30A and the second thickest portion 30B are both off-center toward the second main surface A2, which is one of the main surfaces A and serves as the mounting surface. The first thickest portion 30A is provided in the region 1-4 located off-center toward the first side surface B1, which is one of the side surfaces B, whereas the second thickest portion 30B is provided in the region 2-6 located off-centered toward the second side surface B2, which is the other of the side surfaces B.

However, the present invention is not limited to the above configuration. As illustrated in FIG. 4B, both the first thickest portion 30A and the second thickest portion 30B may be off-center toward the second main surface A2, which is one of the main surfaces A and serves as the mounting surface, such that the first thickest portion 30A and the second thickest portion 30B are respectively in the region 1-4 and the region 2-4, both of which are located off-center toward one of the side surfaces B, for example, the first side surface B1.

Alternatively, as illustrated in FIG. 4C, both the first thickest portion 30A and the second thickest portion 30B may be off-center toward the first main surface A1, which does not serve as the mounting surface, such that the first thickest portion 30A is in the region 1-1 located off-center toward the first side surface B1, which is one of the side surfaces B, and the second thickest portion 30B is in the region 2-3 located off-center toward the second side surface B2, which is the other of the side surfaces B.

Alternatively, as illustrated in FIG. 4D, both the first thickest portion 30A and the second thickest portion 30B may be off-center toward the first main surface A1, which does not serve as the mounting surface, such that the first thickest portion 30A and the second thickest portion 30B are respectively in the region 1-3 and the region 2-3, both of which are located off-center toward one of the side surfaces B, for example, the second side surface B2.

Method of Manufacturing Multilayer Ceramic Capacitor 1

Figure 5:
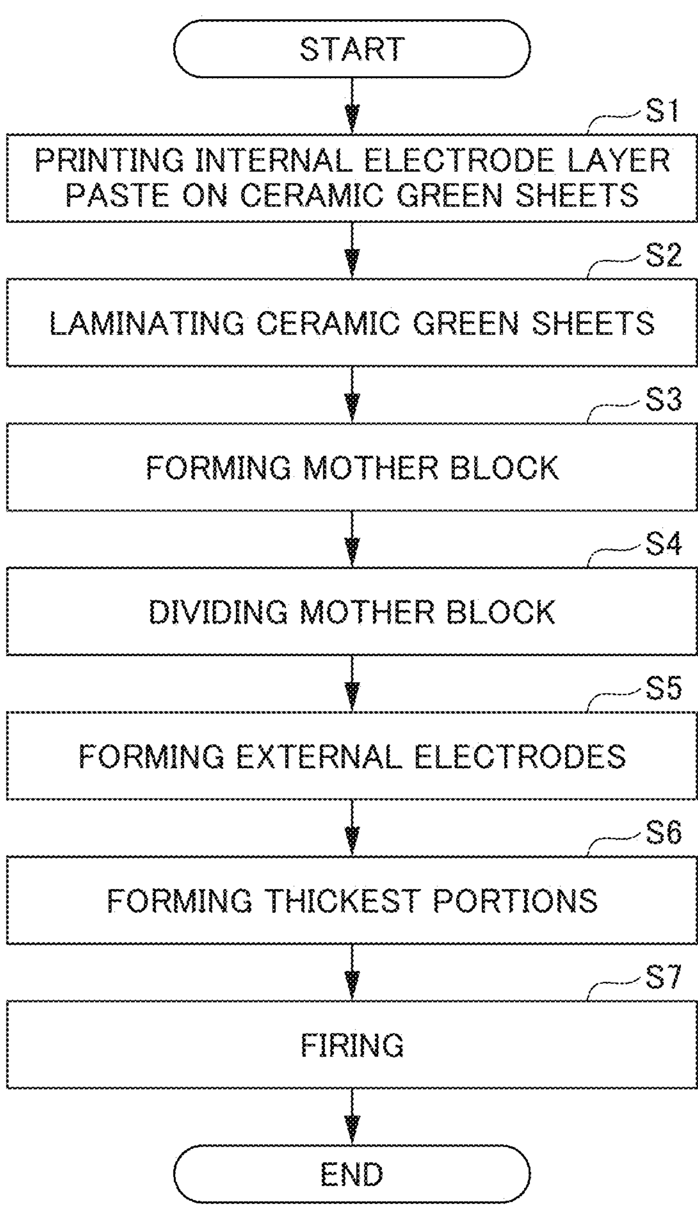
FIG. 5 is a flowchart illustrating a method of manufacturing the multilayer ceramic capacitor 1.

Next, a non-limiting example of a method of manufacturing the multilayer ceramic capacitor 1 will be described. FIG. 5 is a flowchart illustrating the method of manufacturing the multilayer ceramic capacitor 1.

Ceramic Green Sheet Printing Step S1

In Step S1, a ceramic slurry containing ceramic powder, a binder, and a solvent is applied in a sheet shape to a carrier film, thereby forming ceramic green sheets. Subsequently, an internal electrode layer paste containing metal powder, a binder, an additive such as a plasticizer and a dispersant, an organic solvent, and the like is printed in a strip-shaped internal electrode layer pattern on each ceramic green sheet by way of screen printing, inkjet printing, gravure printing, or the like.

Laminating Step S2

The plurality of ceramic green sheets are laminated such that the internal electrode layer patterns are shifted by a half pitch in the length direction L between the ceramic green sheets adjacent to each other in the lamination direction T. Furthermore, on both sides in the lamination direction T of the resultant laminate of the plurality of ceramic green sheets, outer-layer-portion-forming ceramic green sheets are laminated to form the outer layer portions 7.

Mother Block Forming Step S3

Subsequently, the resultant semi-product, which includes the laminate of the plurality of ceramic green sheets and the outer-layer-portion-forming ceramic green sheets for forming the outer layer portions 7 laminated on both sides of the laminate in the lamination direction T, is subjected to thermocompression bonding, thereby forming a mother block.

Mother Block Dividing Step S4

Next, the mother block is divided into a plurality of multilayer bodies 2.

External Electrode Forming Step S5

Both end surfaces C of the multilayer body 2 are dipped into and coated with an external electrode paste containing metal powder, a binder, an additive (a plasticizer, a dispersant, etc.), an organic solvent, etc.

Thickest Portion Forming Step S6

After the external electrode paste is dried, the same external electrode paste is further applied to a position of the surface of the dried external electrode paste where the thickest portion 30 is to be formed.

Firing Step S7

Next, the multilayer body 2 is heated in a nitrogen atmosphere at a preset firing temperature for a predetermined time so that the external electrode paste is fired onto the multilayer body 2, thereby manufacturing the multilayer ceramic capacitor 1 illustrated in FIG. 1.

Mounting Structure 50

Figure 6:
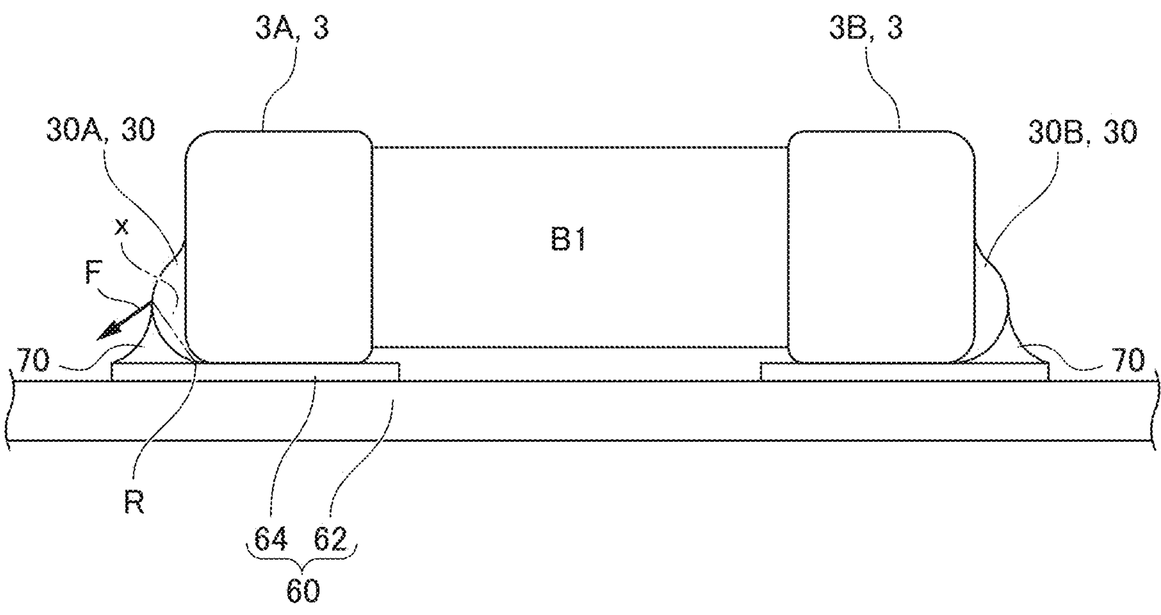
FIG. 6 is a side view of a multilayer ceramic capacitor 1 of an example embodiment of the present invention mounted on a circuit board 60.

The multilayer ceramic capacitor 1 manufactured in the above-described manner is mounted on the circuit board 60. FIG. 6 is a side view of the multilayer ceramic capacitor 1 of the present example embodiment mounted on the circuit board 60.

The circuit board 60 includes a flat core 62 and mounting lands 64 disposed on a surface of the core 62. The core 62 is, for example, a glass epoxy substrate made of a material in which a glass cloth and a glass nonwoven fabric are combined and which is impregnated with an epoxy resin. The mounting lands 64 are formed on one surface or both surfaces of the core 62. The mounting lands 64 are made of, for example, a metal such as Cu, Ag, Pd, or Pt, or an alloy thereof.

The external electrodes 3 of the multilayer ceramic capacitor 1 are connected to the mounting lands 64 with solder 70.

In the mounting structure 50 to mount a multilayer ceramic capacitor 1 of an example embodiment on the circuit board 60, the second main surface A2 of the multilayer ceramic capacitor 1 serves as the mounting surface and faces the circuit board 60. The mounting lands 64 are connected to the first external electrode 3A and the second external electrode 3B with the solder 70.

At the time of reflow soldering, the solder 70 in a molten state climbs up along the sidewalls of the external electrodes 3 to reach the thickest portions 30, and then, shrinks to decrease in surface area when hardening. At this time, the external electrodes 3 are pulled due to the shrinkage of the solder 70.

Here, an imbalance between a tensile force applied to the first external electrode 3A and a tensile force applied to the second external electrode 3B causes the multilayer ceramic capacitor 1 to experience the so-called tombstone phenomenon in which one of the sides that receives a lower tensile force rises so that the multilayer ceramic capacitor 1 is turned and inclined. In this situation, if the thickest portion 30 is provided to protrude from, in particular, the external electrode 3, a particularly strong tensile force acts on the thickest portion 30.

Figure 7:
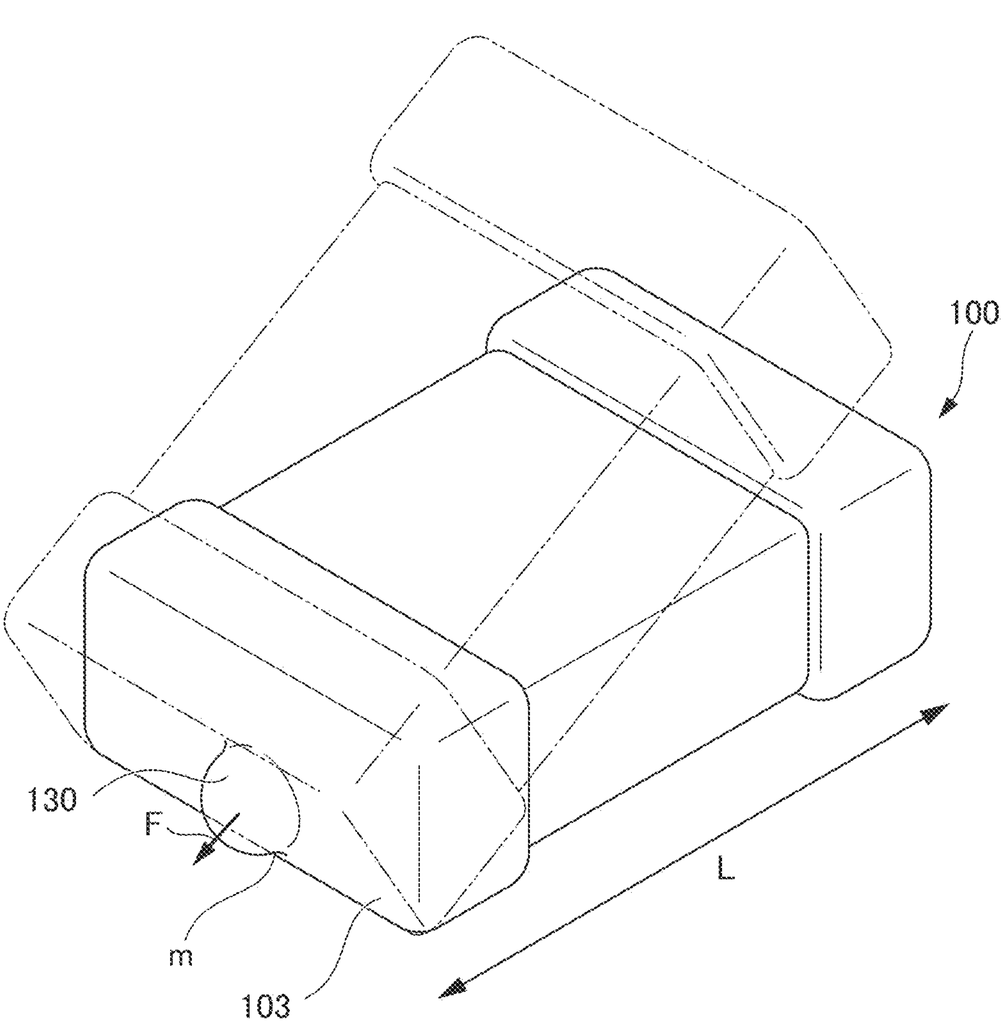
FIG. 7 is a diagram illustrating a multilayer ceramic capacitor 100 according to a comparative example, including external electrodes 103 on end surfaces thereof, and thickest portions 130 each at a central portion of the respective external electrode 103.

In general, during the formation of an external electrode, a thickest portion is likely to be formed in a central portion of an end surface. FIG. 7 illustrates, as a comparative example, a typical multilayer ceramic capacitor 100 having external electrodes 103 on end surfaces thereof, and thickest portions 130 each located at a central position of the respective external electrode 103. In FIG. 7, mutually opposite sides in a longitudinal direction L are referred to as the right and left, respectively. In the case where an imbalance is caused between forces applied to the right and left thickest portions 130 when solder hardens, the external electrode 103 to which the stronger force is applied is inclined downward, and the other external electrode is turned about the tangent line m between a mounting land 64 and the inclined external electrode 103, so that the multilayer ceramic capacitor 100 may rise, as indicated by the two-dot chain line in FIG. 7. FIG. 7 shows a comparative example in order to emphasize and show the benefits and advantages of the present invention.

Figure 8:
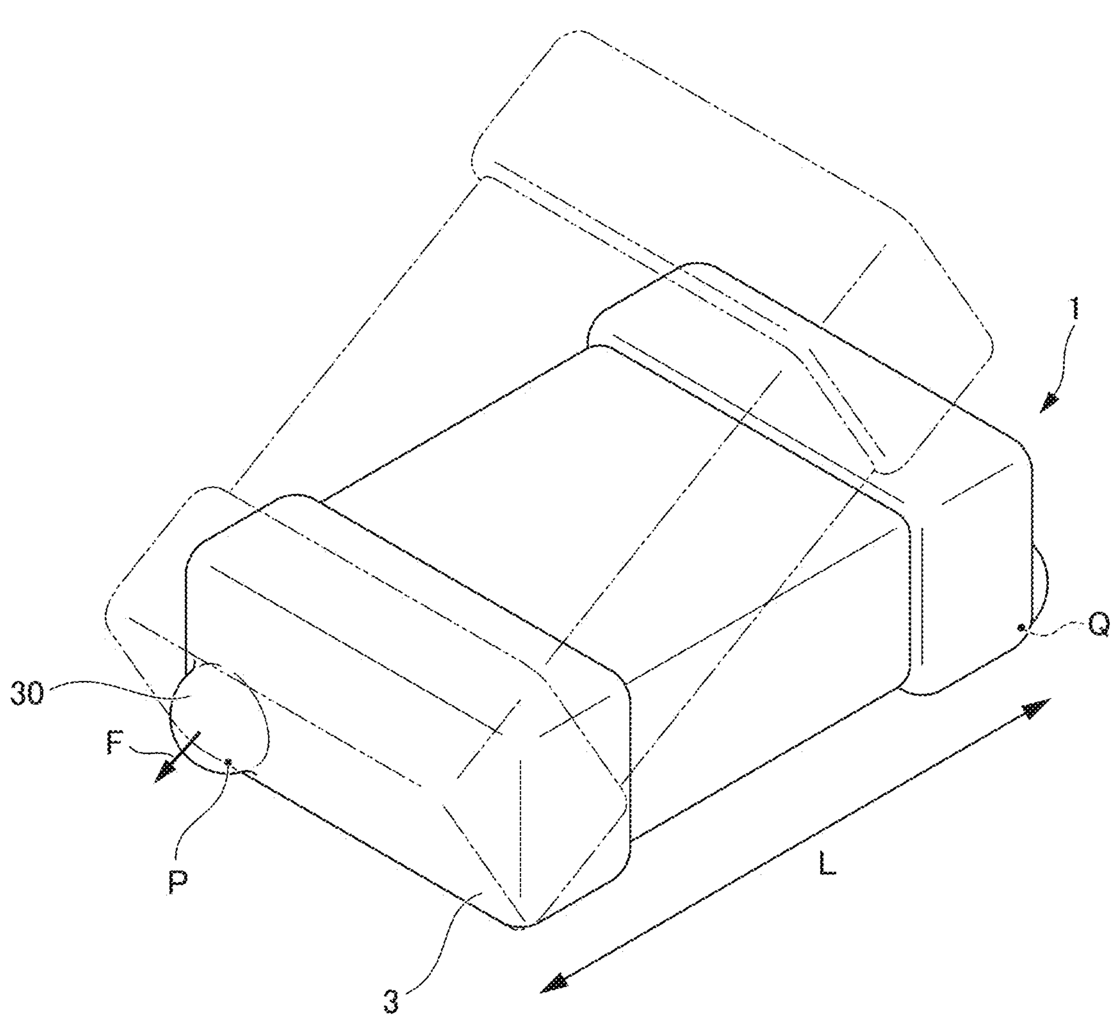
FIG. 8 is a diagram illustrating a multilayer ceramic capacitor 1 according to an example embodiment of the present invention, including thickest portions 30 each off-center toward either one of side surfaces.

FIG. 8 illustrates a multilayer ceramic capacitor 1 according to an example embodiment of the present invention. The multilayer ceramic capacitor 1 includes the thickest portions 30 each located on the respective external electrode 3 at a position off-center in the width direction W toward one side surface.

In this case, the forces applied to the thickest portions 30 cause the multilayer ceramic capacitor 1 to turn about the point P located at an end of the tangent line m between the mounting land 64 and the external electrode 3 instead of the tangent line m between the mounting land 64 and the external electrode 3, so that the multilayer ceramic capacitor 1 may rise from the point Q diagonal to the point P. In this case, a force required to cause the end with the point Q to rise about the point P is greater than a force required to cause the end opposite to the line m to rise about the line m. Therefore, the multilayer ceramic capacitor 1 of the example embodiment illustrated in FIG. 8 is less likely to experience the tombstone phenomenon than the multilayer ceramic capacitor 100 of the comparative example illustrated in FIG. 7.

In addition, it is preferable that the first thickest portion 30A and the second thickest portion 30B of the multilayer ceramic capacitor 1 are off-center toward the second main surface A2 that serves as the mounting surface facing the circuit board 60, on which the multilayer ceramic capacitor 1 is to be mounted.

FIG. 6 illustrates this example embodiment, in which the thickest portions 30 are off-center toward the second main surface A2, which serves as the mounting surface. In contrast to FIG. 6, FIG. 9 illustrates a multilayer ceramic capacitor 1 having the thickest portions 30 that are off-center toward the first main surface A1, which is opposite to the mounting surface.

Figure 9:
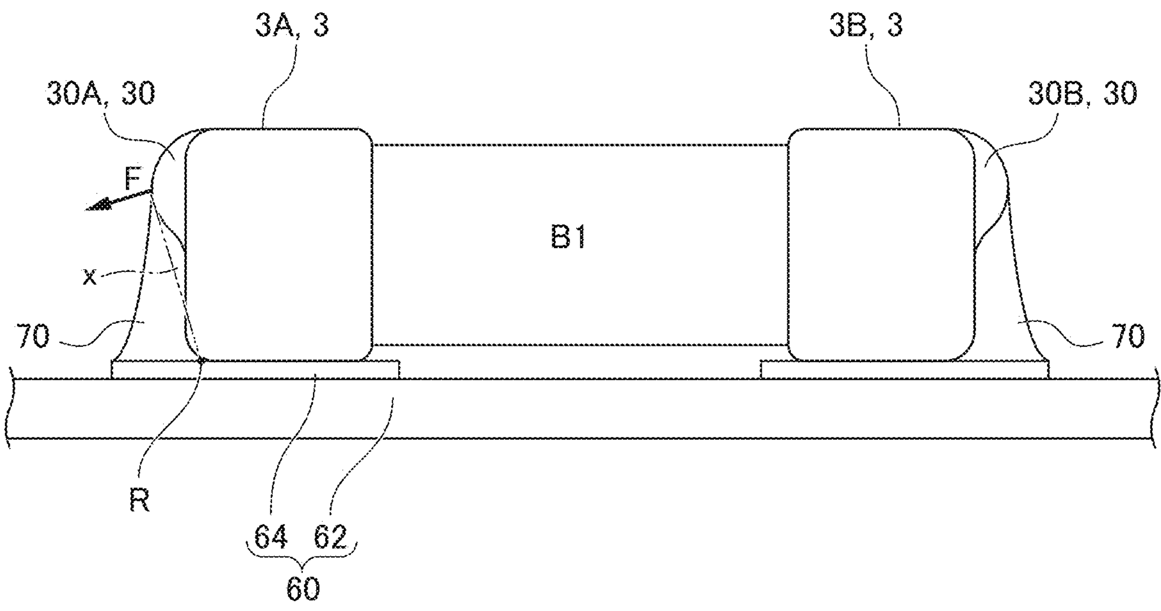
FIG. 9 is a diagram illustrating a multilayer ceramic capacitor 1 including thickest portions 30 off-center toward a first main surface A1 that is opposite to a mounting surface.

In FIGS. 6 and 9, the point R indicates an outermost location in the length direction L of a contact portion between the external electrode 3 of the multilayer ceramic capacitor 1 and the mounting land 64. The distance from the point R to the top of the thickest portion 30 is denoted by x. From among forces with which the thickest portion 30 is pulled by the surface tension of the solder 70, a force acting in a direction orthogonal to the direction in which the distance x extends is denoted by F. When the solder 70 hardens, the multilayer ceramic capacitor 1 receives a rotation moment that is given by x×F and acts about the point R as a rotation axis, in the figures.

This rotation moment, which is given by x×F, is greater in the configuration illustrated in FIG. 6 than in the configuration illustrated in FIG. 9 because the distance x for the multilayer ceramic capacitor in FIG. 6 that has the thickest portions 30 off-center toward the second main surface A2 is shorter than the distance x for the multilayer ceramic capacitor in FIG. 9 that has the thickest portions 30 off-center toward the first main surface A1.

Therefore, the multilayer ceramic capacitor in FIG. 6, which has the thickest portions 30 off-center toward the second main surface A2 serving as the mounting surface is less likely to rotate even if there is a certain imbalance between the rotation moments acting on the left and right ends, and is less likely to experience the tombstone phenomenon.

Furthermore, even if there is an imbalance between the forces F acting on the left and right ends, the thickest portions 30 positioned close in the lamination direction T to the mounting surface reduce the difference between the rotation moments applied to left and right ends of the multilayer ceramic capacitor 1 to a low level. For this reason, it is preferable that the first thickest portion 30A and the second thickest portion 30B are off-center toward the same main surface.

In the multilayer ceramic capacitor of the present example embodiment, the first thickest portion 30A and the second thickest portion 30B are off-center toward the same main surface. That is, since the thickest portions are formed at the same position in the lamination direction T, the rotation moments applied to the ends in the length direction L are less likely to have a difference, and the multilayer ceramic capacitor of the present example embodiment is less likely to experience the tombstone phenomenon.

When the multilayer ceramic capacitor 1 illustrated in FIG. 4A is compared with the multilayer ceramic capacitor 1 illustrated in FIG. 4B, the configuration of FIG. 4A is preferable in that the first thickest portion 30A is off-center toward one of the side surfaces B, for example, the first side surface B1, and the second thickest portion 30B is off-center toward the other of the side surfaces B, for example, the second side surface B2, for the following reasons.

Unlike FIG. 4A, in the case of the multilayer ceramic capacitor 1 of FIG. 4B, the tensile force is concentrated on the first side surface B1. As such, there is a possibility that the multilayer ceramic capacitor 1 of FIG. 4B is turned about the ridge line between the first side surface B1 and the second main surface A2, and consequently, the second side surface B2 rises. In contrast, in the case of the multilayer ceramic capacitor 1 of FIG. 4A, since the tensile force is distributed to the first side surface B1 and the second side surface B2, the possibility that one of the side surfaces of the multilayer ceramic capacitor 1 rises decreases.

Furthermore, when the dimension of the multilayer ceramic capacitor 1 in the lamination direction T is defined as T1, and the dimension of the multilayer ceramic capacitor 1 in the width direction W is defined as W1, it is preferable that W1/2≥T1 is satisfied, for the following reasons.

As described above with reference to FIGS. 6 and 9, positioning the thickest portions 30 at a short distance in the lamination direction T from the mounting surface reduces the rotation moments. Therefore, in the case where the thickness T1 of the multilayer ceramic capacitor 1 in the lamination direction T is smaller than the width W1 in the width direction W so that W1/2≥T1 is satisfied, the distance to the thickest portion 30 from the mounting surface also becomes relatively small. Therefore, the rotation moments with respect to the size of the multilayer ceramic capacitor 1 become small, thereby reducing or preventing the occurrence of the tombstone phenomenon. In particular, a configuration in which the thickest portions 30 are provided in a region having a height not exceeding T1/2, which is the position of the center of gravity of the multilayer ceramic capacitor 1, makes it possible to further reduce the likelihood of the occurrence of tombstone phenomenon.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:

a multilayer body including a plurality of internal electrode layers and a plurality of dielectric layers that are alternately laminated, the multilayer body including surfaces opposite to each other in a lamination direction defining main surfaces, surfaces opposite to each other in a length direction that intersects with the lamination direction defining end surfaces, and surfaces opposite to each other in a width direction that intersects with the lamination direction and the length direction defining side surfaces, and external electrodes on the end surfaces of the multilayer body, respectively;

each of the external electrodes including a thickest portion at a position off-center in the width direction toward either one of the side surfaces, the thickest portion being thicker in the length direction than a remainder of the external electrode.

2. The multilayer ceramic capacitor according to claim 1, wherein the external electrodes include:

a first external electrode on a first end surface that is one of the end surfaces; and a second external electrode on a second end surface that is an other of the end surfaces;

the thickest portion includes:

a first thickest portion on the first external electrode; and a second thickest portion on the second external electrode; and the first thickest portion and the second thickest portion are off-center toward a same one of the main surfaces.

3. The multilayer ceramic capacitor according to claim 2, wherein the first thickest portion and the second thickest portion are off-center toward one of the main surfaces that faces a circuit board on which the multilayer ceramic capacitor is to be mounted.

4. The multilayer ceramic capacitor according to claim 2, wherein the side surfaces include a first side surface adjacent to one end in the width direction, and a second side surface adjacent to an other end in the width direction;

the first thickest portion is off-center toward the first side surface; and the second thickest portion is off-center toward the second side surface.

5. The multilayer ceramic capacitor according to claim 2, wherein the side surfaces include a first side surface adjacent to one end in the width direction, and a second side surface adjacent to an other end in the width direction;

the first thickest portion and the second thickest portion are off-center toward a same one of the first side surface and the second side surface.

6. The multilayer ceramic capacitor according to claim 2, wherein the same one of the main surfaces that the first thickest portion and the second thickest portion are off-center toward is a mounting surface to mount the multilayer ceramic capacitor on a board.

7. The multilayer ceramic capacitor according to claim 2, wherein the same one of the main surfaces that the first thickest portion and the second thickest portion are off-center toward is not a mounting surface to mount the multilayer ceramic capacitor on a board.

8. The multilayer ceramic capacitor according to claim 1, wherein the multilayer ceramic capacitor has a dimension T1 in the lamination direction and a dimension W1 in the width direction, and W1/2≥T1 is satisfied.

9. The multilayer ceramic capacitor according to claim 1, wherein the thickest portion protrudes by about 10 μm or more in the length direction.

10. The multilayer ceramic capacitor according to claim 1, wherein the thickest portion defines a convexity protruding from the remainder of the external electrode.

11. A mounting structure to mount the multilayer ceramic capacitor according to claim 1 on a circuit board, wherein one of the main surfaces that is closer to the thickest portion of the multilayer ceramic capacitor faces the circuit board.

12. The mounting structure according to claim 11, wherein the external electrodes include:

a first external electrode on a first end surface that is one of the end surfaces; and a second external electrode on a second end surface that is an other of the end surfaces;

the thickest portion includes:

a first thickest portion on the first external electrode; and a second thickest portion on the second external electrode; and the first thickest portion and the second thickest portion are off-center toward a same one of the main surfaces.

13. The mounting structure according to claim 12, wherein the first thickest portion and the second thickest portion are off-center toward one of the main surfaces that faces a circuit board on which the multilayer ceramic capacitor is to be mounted.

14. The mounting structure according to claim 12, wherein the side surfaces include a first side surface adjacent to one end in the width direction, and a second side surface adjacent to an other end in the width direction;

the first thickest portion is off-center toward the first side surface; and the second thickest portion is off-center toward the second side surface.

15. The mounting structure according to claim 12, wherein the side surfaces include a first side surface adjacent to one end in the width direction, and a second side surface adjacent to an other end in the width direction;

the first thickest portion and the second thickest portion are off-center toward a same one of the first side surface and the second side surface.

16. The mounting structure according to claim 12, wherein the same one of the main surfaces that the first thickest portion and the second thickest portion are off-center toward is a mounting surface to mount the multilayer ceramic capacitor on a board.

17. The mounting structure according to claim 12, wherein the same one of the main surfaces that the first thickest portion and the second thickest portion are off-center toward is not a mounting surface to mount the multilayer ceramic capacitor on a board.

18. The mounting structure according to claim 11, wherein the multilayer ceramic capacitor has a dimension T1 in the lamination direction and a dimension W1 in the width direction, and W1/2≥T1 is satisfied.

19. The mounting structure according to claim 11, wherein the thickest portion protrudes by about 10 μm or more in the length direction.

20. The mounting structure according to claim 11, wherein the thickest portion defines a convexity protruding from the remainder of the external electrode.

* * * * *